(12) United States Patent
Ito

(10) Patent No.: US 11,624,955 B2
(45) Date of Patent: Apr. 11, 2023

(54) LIQUID CRYSTAL DEVICE AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/497,082

(22) Filed: Oct. 8, 2021

(65) Prior Publication Data

US 2022/0113598 A1 Apr. 14, 2022

(30) Foreign Application Priority Data

Oct. 9, 2020 (JP) .............................. JP2020-170866

(51) Int. Cl.
*G02F 1/1343* (2006.01)

(52) U.S. Cl.
CPC .... *G02F 1/134309* (2013.01); *G02F 1/13439* (2013.01)

(58) Field of Classification Search
None
See application file for complete search history.

(56) References Cited

U.S. PATENT DOCUMENTS

| 6,414,734 | B1 * | 7/2002 | Shigeta | G02F 1/133553 349/5 |
| 2007/0146598 | A1 * | 6/2007 | Yokokawa | G02F 1/1337 349/123 |
| 2016/0026026 | A1 * | 1/2016 | Kim | G02F 1/1337 349/123 |

FOREIGN PATENT DOCUMENTS

| JP | H8-106095 A | 4/1996 |
| JP | 2007-219365 A | 8/2007 |
| JP | 2010-78998 A | 4/2010 |
| JP | 2011-81187 A | 4/2011 |

* cited by examiner

*Primary Examiner* — Ryan Crockett
(74) *Attorney, Agent, or Firm* — Oliff PLC

(57) ABSTRACT

In a liquid crystal device, an intermediate refractive index film including a silicon nitride film, a silicon oxynitride film, or an aluminum oxide film is provided between an oriented film formed of a diagonally vapor-deposited film of silicon oxide and an electrode containing ITO. Thus, because there are no interfaces having a large refractive index difference between the oriented film and the electrode, reflection between the oriented film and the electrode can be suppressed. A high density silicon oxide film is formed between the intermediate refractive index film and the oriented film. The high density silicon oxide film is formed by an atomic deposition method, thus is appropriately formed inside a contact hole.

12 Claims, 13 Drawing Sheets

LIQUID CRYSTAL DEVICE AND ELECTRONIC APPARATUS

The present application is based on, and claims priority from JP Application Serial Number 2020-170866, filed Oct. 9, 2020, the disclosure of which is hereby incorporated by reference herein in its entirety.

BACKGROUND

1. Technical Field

The present disclosure relates to a liquid crystal device in which an electrode containing ITO is covered with an oriented film formed of a diagonally vapor-deposited film, and to an electronic apparatus.

2. Related Art

A liquid crystal device used as a light valve of a projection-type display apparatus is provided with a liquid crystal layer between a first substrate and a second substrate facing the first substrate. An electrode containing ITO and an oriented film formed of a diagonally vapor-deposited film of silicon oxide stacked on the liquid crystal layer side with respect to the electrode are provided at a surface of the first substrate facing the second substrate, and at a surface of the second substrate facing the first substrate. In addition, a configuration has been proposed in which diffusion of impurities and the like is suppressed by providing a silicon oxide film formed by an atomic deposition method between the electrode and the oriented film (see JP 2007-219365 A).

In the technology described in JP 2007-219365 A, the electrode containing ITO is in contact with the silicon oxide film. Here, because a difference in refractive index is large between respective interfaces of the electrode and the silicon oxide film, there is a problem in that reflection of light at the interface of the electrode is large. Such reflection is not desirable as efficiency of light utilization is reduced.

SUMMARY

In order to solve the above problems, an aspect of a liquid crystal device according to the present disclosure includes a first substrate, a second substrate facing the first substrate, and a liquid crystal layer disposed between the first substrate and the second substrate, wherein the first substrate or the second substrate includes an electrode containing ITO, an oriented film provided between the electrode and the liquid crystal layer, and containing silicon oxide, and an intermediate refractive index film provided between the electrode containing ITO and the oriented film, and having a refractive index between a refractive index of the electrode containing ITO and a refractive index of the oriented film.

The liquid crystal device to which the present disclosure is applied is used for a variety of electronic apparatuses. In the present disclosure, when an electronic apparatus is a projection-type display apparatus, the projection-type display apparatus is provided with a light-source unit configured to emit light to be supplied to the liquid crystal device, and a projection optical system configured to project light modulated by the liquid crystal device.

DESCRIPTION OF EXEMPLARY EMBODIMENTS

Figure 1:
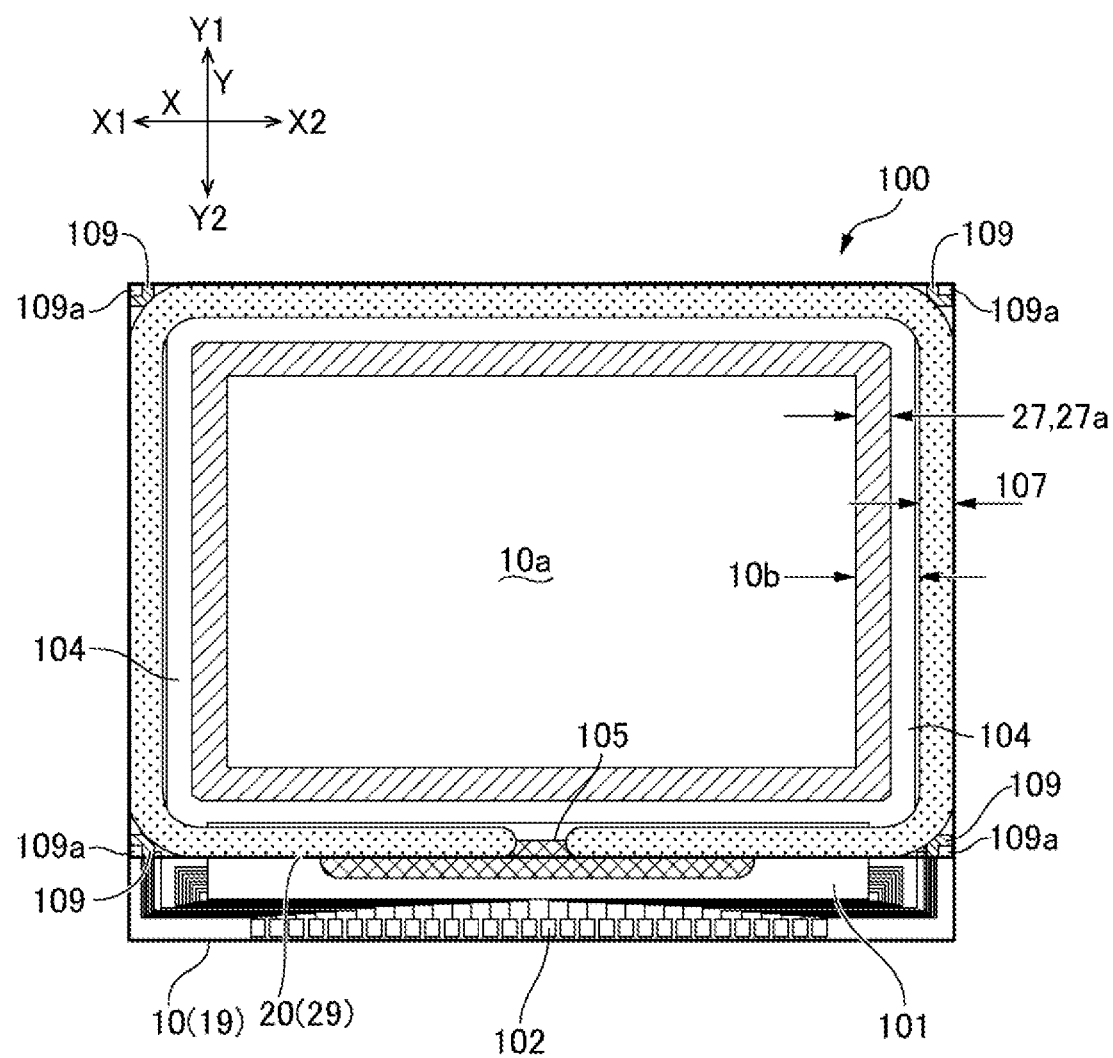
FIG. 1 is a plan view of a liquid crystal device according to Exemplary Embodiment 1 of the present disclosure.

Exemplary embodiments of the disclosure will be described below with reference to the drawings. Note that, in each of the figures to be referred to in the following description, to illustrate each layer, each member, and the like in a recognizable size in the drawings, each layer, each member, and the like are illustrated at a different scale. Moreover, in the description described below, when each layer formed in a first substrate 10 is described, an upper layer side or a front surface side means a side (a side on which a second substrate 20 is located) opposite to a side on which a substrate body 19 is located, and a bottom layer side means a side on which the substrate body 19 is located. In addition, of two directions intersecting in in-plane directions of the first substrate 10, a direction in which a scan line 3a extends is referred to as a first direction X, and a direction in which a data line 6a extends is referred to as a second direction Y. In addition, one side in a direction along the first direction X is referred to as one side X1 in the first direction X, another side in the direction along the first direction X is referred to as another side X2 in the first direction X, one side in a direction along the second direction Y is referred to as one side Y1 in the second direction Y, and another side in the direction along the second direction Y is referred to as another side Y2 in the second direction Y. In the present disclosure, a "width direction" refers to a direction orthogonal to an extension direction. For example, since the scan line 3a and a semiconductor film 31a described below extend in the first direction X, both a width direction of the scan line 3a and a width direction of the semiconductor film 31a are the second direction Y.

Exemplary Embodiment 1

1. Configuration of Liquid Crystal Device 100

Figure 2:
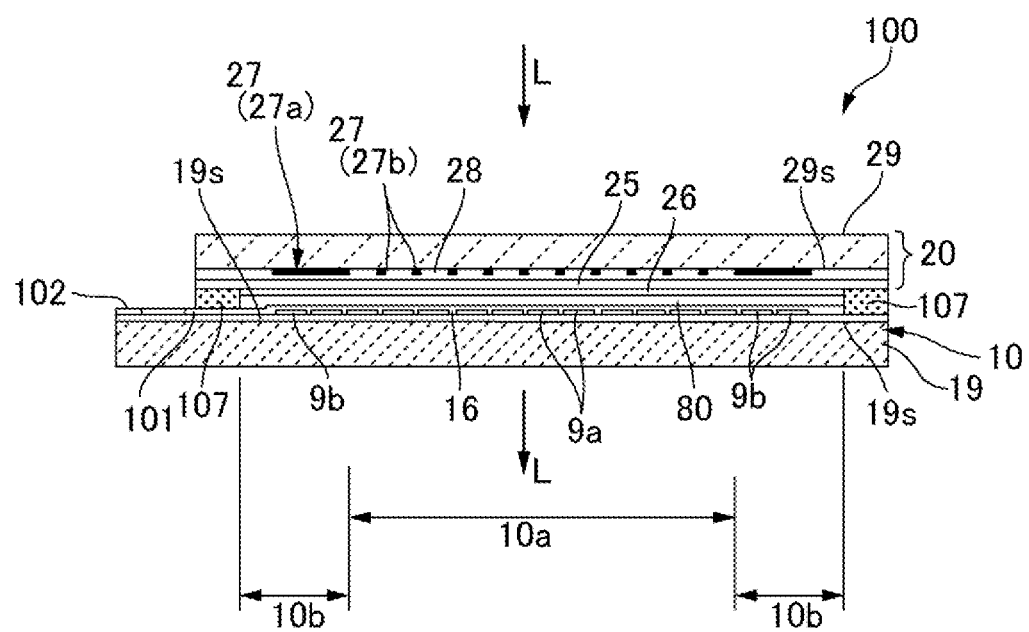
FIG. 2 is a cross-sectional view of the liquid crystal device illustrated in FIG. 1.

FIG. 1 is a plan view of a liquid crystal device 100 according to Exemplary Embodiment 1 of the present disclosure. FIG. 2 is a cross-sectional view of the liquid crystal device 100 illustrated in FIG. 1. As illustrated in FIG. 1 and FIG. 2, in the liquid crystal device 100, the first substrate 10 and the second substrate 20 are bonded together with a seal material 107 creating a predetermined gap, where the first substrate 10 is opposed to the second substrate 20. The seal material 107 is provided in a frame-like shape in conformance with an outer edge of the second substrate 20. A liquid crystal layer 80 is provided in an area surrounded by the seal material 107 between the first substrate 10 and the second substrate 20. The seal material 107 is a photocurable adhesive, or a photocurable and thermosetting adhesive, and a gap material such as glass fiber or glass beads for setting a distance between the substrates to a predetermined value is compounded in the seal material 107. The first substrate 10 and the second substrate 20 both have a quadrangle shape, and in a substantially central portion of the liquid crystal device 100, a display region 10a is provided as a quadrangle region. In accordance with such a shape, the seal material 107 is also provided in a substantially quadrangular shape, and a peripheral area 10b having a rectangular frame shape is provided between an inner peripheral edge of the seal material 107 and an outer peripheral edge of the display region 10a.

The first substrate 10 includes the transmissive substrate body 19 such as a quartz substrate or a glass substrate. On one surface 19s side of the substrate body 19 on the second substrate 20 side, on an outer side of the display region 10a, a data line driving circuit 101 and a plurality of terminals 102 are provided along one side of the first substrate 10. A scan line driving circuit 104 is provided along other sides adjacent to the one side. Although not illustrated, a flexible wiring substrate is coupled to the terminals 102, and various types of potential and various signals are input to the first substrate 10 via the flexible wiring substrate.

On the one surface 19s side of the substrate body 19, in the display region 10a, Indium Tin Oxide (ITO) electrodes 9a constituting a plurality of transmissive pixel electrodes are formed in a matrix, and each of the plurality of electrodes 9a containing ITO forms a pixel. An oriented film 16 is formed on the second substrate 20 side with respect to the electrodes 9a, and the electrodes 9a are covered with the oriented film 16. Accordingly, from the substrate body 19 to the oriented film 16 correspond to the first substrate 10.

The second substrate 20 includes a transmissive substrate body 29 such as a quartz substrate or a glass substrate. On one surface 29s side, which faces the first substrate 10, of the substrate body 29, an electrode 25 containing ITO constituting a transmissive common electrode is formed. An oriented film 26 is formed on the first substrate 10 side with respect to the electrode 25. Therefore, from the substrate body 29 to the oriented film 26 correspond to the second substrate 20. The electrode 25 is formed over substantially the entire surface of the second substrate 20, and is covered with the oriented film 26. At the second substrate 20, a light shielding member 27 including resin, metal, or a metal compound is formed between the substrate body 29 and the electrode 25. A transmissive protective film 28 is formed between the light shielding member 27 and the electrode 25. The light shielding member 27 is formed, for example, as a parting 27a in a frame-like shape extending along the outer peripheral edge of the display region 10a. The light shielding member 27 is also formed as a black matrix 27b in regions overlapping in plan view with regions each located between the electrodes 9a adjacent to each other. Regions overlapping, when viewed in plan view, with the parting 27a in the peripheral area 10b of the first substrate 10 are formed with dummy pixel electrodes 9b formed simultaneously with the electrodes 9a. Note that, a lens may be provided at a position facing the electrode 9a at the second substrate 20, and in this case, the black matrix 27b is often not formed.

Any of the oriented films 16 and 26 is an inorganic oriented film including a diagonally vapor-deposited film of $SiO_x$ (x<2), $SiO_2$, $TiO_2$, MgO, $Al_2O_3$, and the like, and liquid crystal molecules having negative dielectric anisotropy used for the liquid crystal layer 80 are tilt-oriented. Therefore, the liquid crystal molecules form a predetermined angle with respect to the first substrate 10 and the second substrate 20. In the present exemplary embodiment, the oriented films 16 and 26 are made of silicon oxide. In this way, the liquid crystal device 100 is constituted as a liquid crystal device of a Vertical Alignment (VA) mode.

The first substrate 10 includes an inter-substrate conduction electrode 109 being formed in a region positioning outside the seal material 107 and overlapping with a corner portion of the second substrate 20 such that electrical conduction is established between the first substrate 10 and the second substrate 20. An inter-substrate conduction material 109a including conductive particles is disposed in the inter-substrate conduction electrode 109. The electrode 25 of the second substrate 20 is electrically coupled to the first substrate 10 side via the inter-substrate conduction material 109a and the inter-substrate conduction electrode 109. Therefore, common potential is applied to the electrode 25 from the first substrate 10 side.

In the present exemplary embodiment, the liquid crystal device 100 is configured as a transmissive liquid crystal device. In the liquid crystal device 100, of the first substrate 10 and the second substrate 20, light that is incident to the liquid crystal layer 80 from either one of the substrates is modulated while passing through the other substrate and being emitted, and displays an image. In the present exemplary embodiment, the light incident from the second substrate 20, as indicated by an arrow L, is modulated by the liquid crystal layer 80 at each pixel while passing through the first substrate 10 and being emitted, thereby displaying an image.

2. Schematic Configuration of Pixel

Figure 3:
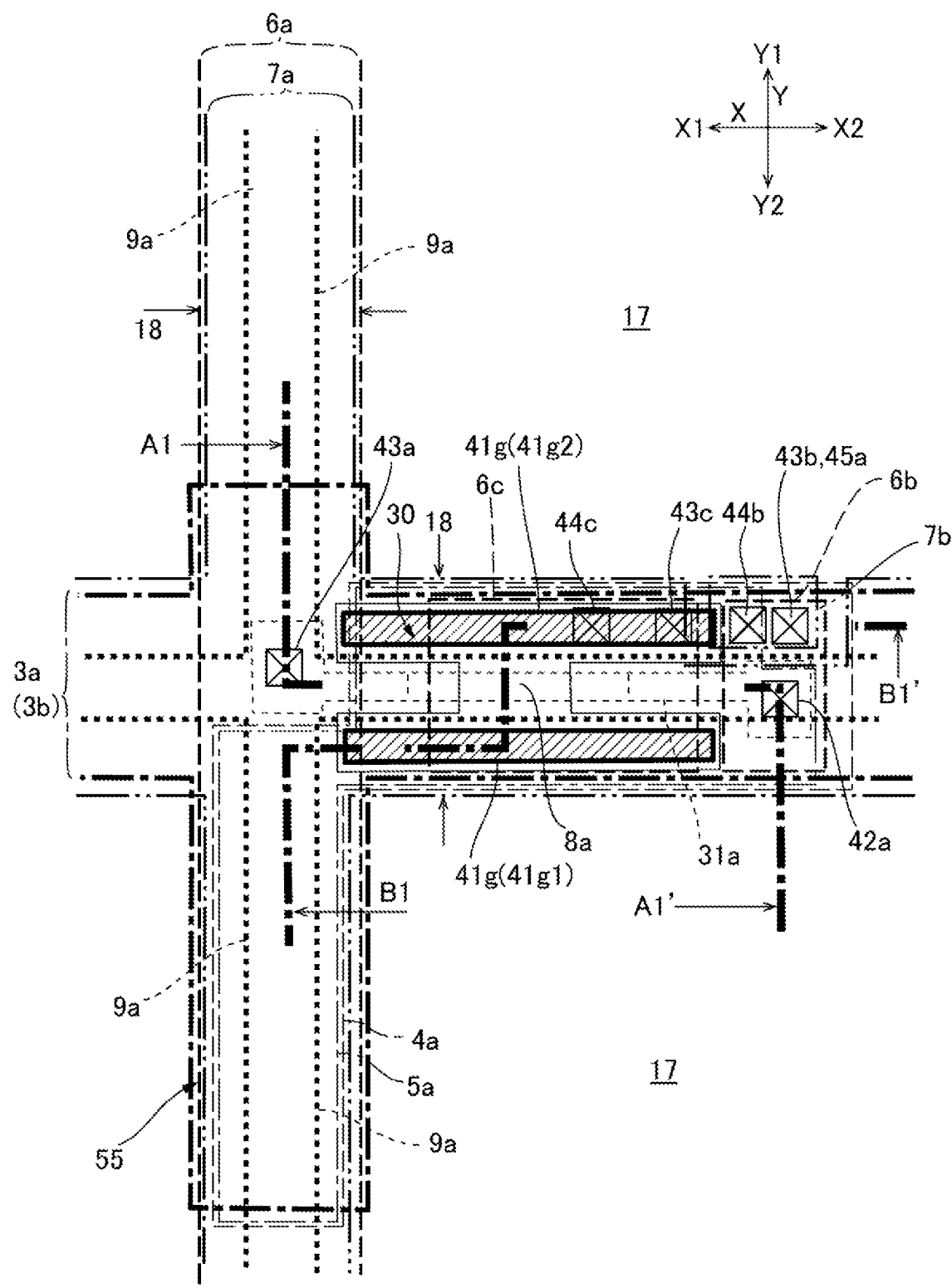
FIG. 3 is an enlarged plan view illustrating one of pixels of the liquid crystal device illustrated in FIG. 1.
Figure 4:
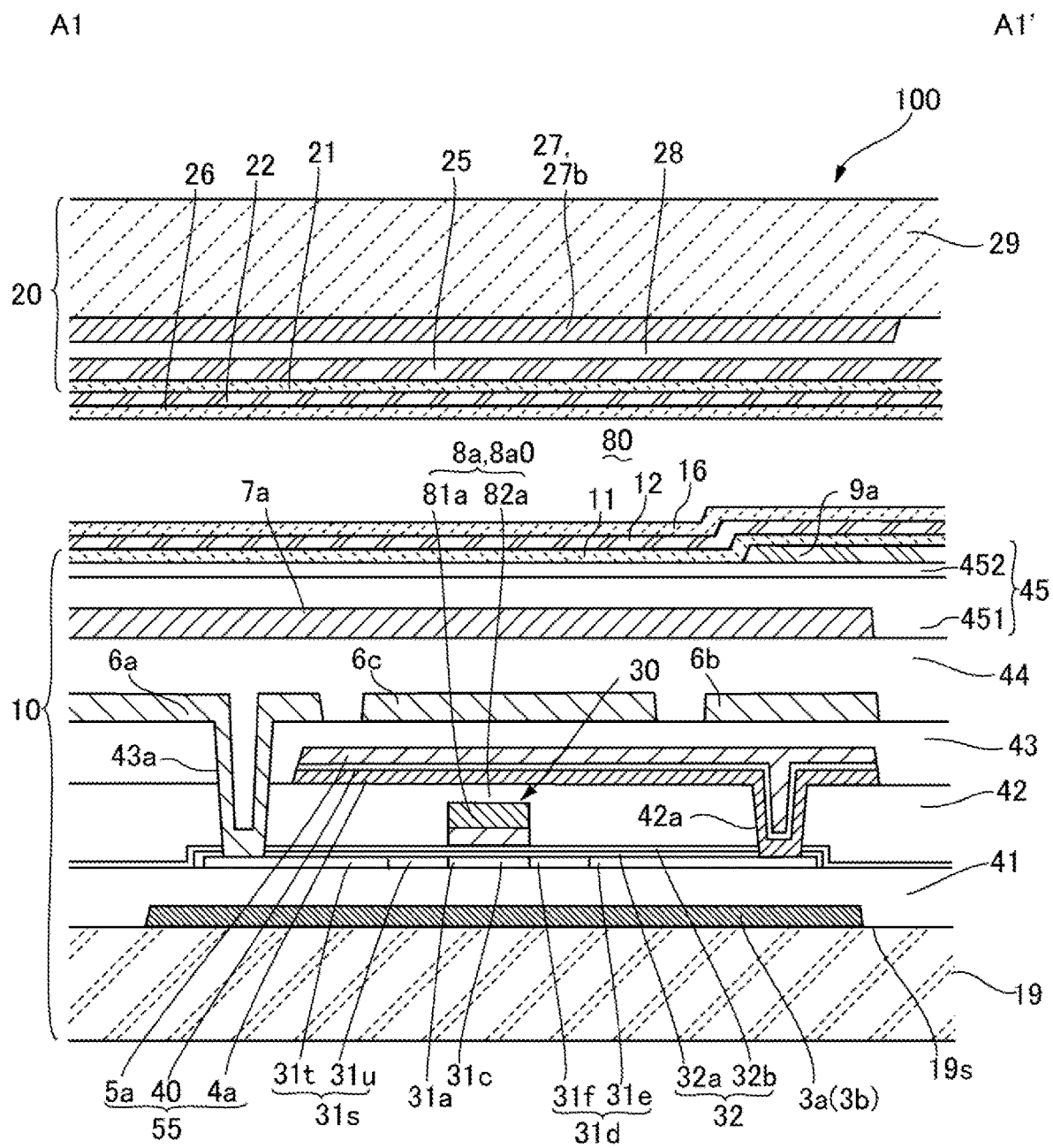
FIG. 4 is an A1-A1' cross-sectional view of FIG. 3.
Figure 5:
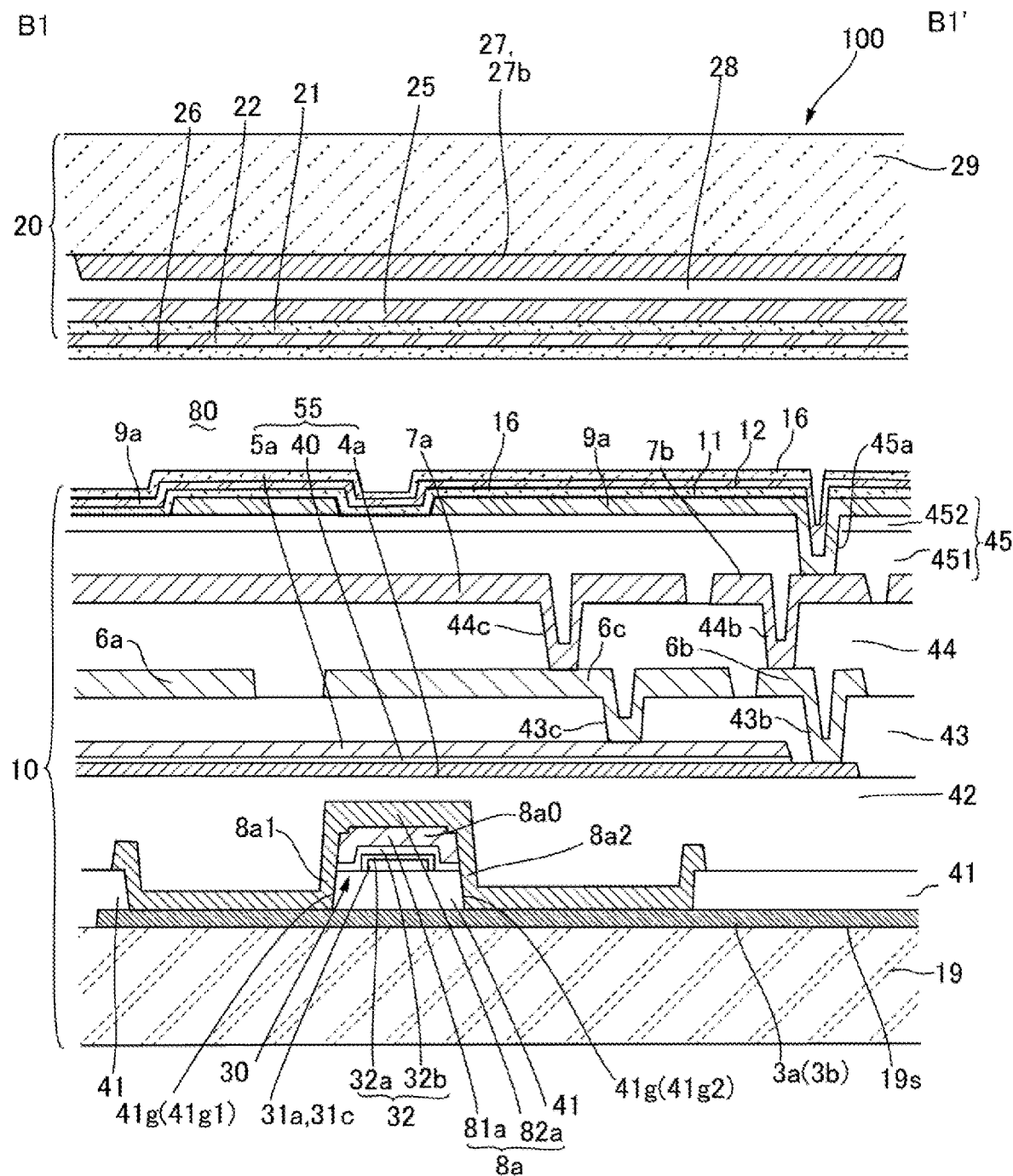
FIG. 5 is a B1-B1' cross-sectional view of FIG. 3.

FIG. 3 is an enlarged plan view illustrating one of the pixels of the liquid crystal device 100 illustrated in FIG. 1, and FIG. 3 illustrates a vicinity of a transistor 30 enlarged. FIG. 4 is the A1-A1' cross-sectional view of FIG. 3. FIG. 5 is the B1-B1' cross-sectional view of FIG. 3. Note that, in FIG. 3, each layer is indicated by a line described below. Moreover, note that, in FIG. 3, as for layers including ends overlapping each other in plan view, positions of the end portions are displaced to make shapes and the like of the layers readily recognizable.

The scan line 3a is indicated by a thick long dashed short dashed line

The semiconductor film 31a is indicated by a thin and short dashed line

A gate electrode 8a is indicated by a thin solid line

A first capacitance electrode 4a is indicated by a thin and long dashed line

A second capacitance electrode 5a is indicated by a thin long dashed short dashed line The data line 6a and relay electrodes 6b and 6c are each indicated by a thick and long dashed line A capacitance line 7a and a relay electrode 7b are each indicated by a thick two-dot chain line The electrode 9a is indicated by a thick and short dashed line As illustrated in FIG. 3, the electrode 9a is formed in each of the plurality of pixels on a surface of the first substrate 10 facing the second substrate 20, where the scan line 3a, the data line 6a, and the capacitance line 7a extend along an inter-pixel region between the electrodes 9a adjacent to each other. The data line 6a extends in the second direction Y in the inter-pixel region. The scan line 3a extends in the first direction X in the inter-pixel region. The capacitance line 7a extends in the first direction X and the second direction Y in the inter-pixel region. Further, the transistor 30 is formed corresponding to an intersection between the data line 6a and the scan line 3a. The scan line 3a, the data line 6a, and the capacitance line 7a each have a light shielding property. Accordingly, a region where the scan line 3a, the data line 6a, the capacitance line 7a, and an electrode in the same layer as these lines are formed serves as the light shielding region 18 through which light does not transmit, and a region surrounded by the light shielding region 18 serves as an aperture region 17 through which light transmits. In addition, a ratio occupied by the aperture region 17 in one pixel corresponds to a pixel opening ratio.

As illustrated in FIGS. 4 and 5, in the first substrate 10, an interlayer insulating film 41 is provided in a layer between the substrate body 19 and the semiconductor film 31a of the transistor 30, and in the first substrate 10, an interlayer insulating film 42 covering the transistor 30 from a side opposite to the substrate body 19 is provided. In addition, interlayer insulating films 43, 44, and 45 are sequentially stacked in a layer between the interlayer insulating film 42 and the electrode 9a. The interlayer insulating films 41, 42, 43, 44, and 45 each include a transmissive insulating film such as silicon oxide. In the present exemplary embodiment, the interlayer insulating films 41, 42, and 45 each have a surface on the electrode 9a side that is a continuous plane by a flattening process such as chemical mechanical polishing or the like. The interlayer insulating film 45 includes a silicon oxide film 451, and a borosilicate glass film 452 (borosilicate glass (BSG)) stacked on an upper layer of the silicon oxide film 451. The borosilicate glass film 452 functions to adsorb moisture contained in the liquid crystal layer 80.

3. Detailed Description of Each Layer

As illustrated in FIGS. 4 and 5, in the first substrate 10, a light shielding film 3b is provided in a layer between the substrate body 19 and the interlayer insulating film 41. In the present exemplary embodiment, the light shielding film 3b constitutes the scan line 3a that extends along the first direction X. The light shielding film 3b is formed of a light shielding conductive film such as a metal film or a metal compound film. In the present exemplary embodiment, the light shielding film 3b is formed of tungsten silicide, tungsten, titanium nitride, and the like.

In a layer between the interlayer insulating film 41 and the interlayer insulating film 42 is formed the transistor 30 for pixel switching. The transistor 30 includes the semiconductor film 31a formed at a surface of the interlayer insulating film 41 on an opposite side to the substrate body 19, a gate insulating film 32 stacked on the electrode 9a side of the semiconductor film 31a, and the gate electrode 8a overlapping in plan view with the semiconductor film 31a on the electrode 9a side of the gate insulating film 32. The semiconductor film 31a includes a polysilicon film. The gate insulating layer 32 has two-layer structure including a first gate insulating film 32a including a silicon oxide film that is obtained by thermally oxidizing the semiconductor film 31a, and a second gate insulating layer 32b including a silicon oxide film that is formed by using, for example, a low-pressure CVD method. The gate electrode 8a is formed of a conductive film such as a conductive polysilicon film, a metal film, or a metal compound film.

The scan line 3a extends in the first direction X. The semiconductor film 31a extends from an intersecting portion of the scan line 3a and the data line 6a to the other side X2 in the first direction X, and overlaps in plan view with the scan line 3a. A portion of the semiconductor film 31a overlapping in plan view with the gate electrode 8a is a channel area 31c. In the present exemplary embodiment, the transistor 30 has lightly doped drain (LDD) structure. Accordingly, in the semiconductor film 31a, a pixel electrode side source drain region 31d on the other side X2 in the first direction X with respect to the channel area 31c includes a first contact region 31e spaced apart from the channel area 31c in the first direction X, and a first low concentration region 31f sandwiched between the first contact region 31e and the channel area 31c, and the first low concentration region 31f has lower impurity concentration compared to the first contact region 31e. In addition, in the semiconductor film 31a, a data line side source drain region 31s on the other side X1 in the first direction X with respect to the channel area 31c includes a second contact region 31t spaced apart from the channel area 31c on an opposite side to the first contact region 31e, and a second low concentration region 31u sandwiched between the second contact region 31t and the channel area 31c, and the second low concentration region 31u has lower impurity concentration compared to the second contact region 31t. A portion of each of the first contact region 31e and the second contact region 31t is used for electrical coupling with an electrode or wiring on an upper layer side.

A groove 41g for electrically coupling the scan line 3a and the gate electrode 8a of the transistor 30 is provided in the interlayer insulating film 41. The grooves 41g are provided as a first groove 41g1 that extends through the interlayer insulating film 41 so as to reach the scan line 3a through a side of the semiconductor film 31a, and a second groove 41g2 that extends through the interlayer insulating film 41 so as to reach the scan line 3a on a side of the semiconductor film 31a on an opposite side to the first groove 41g1. The first groove 41g1 and the second groove 41g2 extend in the first direction X along the semiconductor film 31a through both sides of the semiconductor film 31a, respectively, and overlap in plan view with both the gate electrode 8a and the scan line 3a.

The gate electrode 8a is configured by stacking the conductive polysilicon film 81a extending in the second direction Y so as to intersect with the semiconductor film 31a, and the light shielding conductive film 82a that covers the polysilicon film 81a. A conductive light shielding material used in the conductive film 82a has a higher light shielding property and smaller resistance compared to the polysilicon film 81a. For example, the conductive film 82a is formed of a silicide film such as a tungsten silicide film.

The conductive film 82a is formed over a wider range than the polysilicon film 81a, and covers the entire polysilicon film 81a. Therefore, an electrode portion 8a0 in which the polysilicon film 81a is formed in the gate electrode 8a has two-layer structure of the polysilicon film 81a and the light shielding conductive film 82a, and has single layer structure of the conductive film 82a in a region in the gate electrode 8a where the polysilicon film 81a is not formed. Thus, each of the first groove 41g1 and the second groove 41g2 is not formed with the polysilicon film 81a inside thereof, and has single layer structure of the conductive film 82a. In contrast, an outer portion of the groove 41g of the electrode portions 8a0 has two-layer structure of the polysilicon film 81a and the conductive film 82a.

The conductive film 82a is provided along an entire inner wall of each of the first groove 41g1 and the second groove 41g2, and electrically coupling the gate electrode 8a and the scan line 3a. Thus, a scanning signal is applied to the gate electrode 8a from the scan line 3a. Additionally, the conductive film 82a constitutes a first light shielding wall 8a1 penetrating through the interlayer insulating film 41 so as to reach the scan line 3a through a side of the semiconductor film 31a, and a second light shielding wall 8a2 penetrating through the interlayer insulating film 41 so as to reach the scan line 3a on a side of the semiconductor film 31a on an opposite side to the first light shielding wall 8a1.

On an upper layer side of the transistor 30, a capacitance element 55 is constituted by a stacked film in which the first capacitance electrode 4a, a dielectric film 40, and the second capacitance electrode 5a are sequentially stacked in a layer between the interlayer insulating film 42 and the interlayer insulating film 43. The capacitance element 55 is a retention capacitor that prevents a fluctuation in an image signal retained by a liquid crystal capacitor configured between the electrode 9a and the electrode 25. The first capacitance electrode 4a and the second capacitance electrode 5a are each formed of a conductive polysilicon film, a metal film, a metal compound film, and the like. In the present exemplary embodiment, the first capacitance electrode 4a and the second capacitance electrode 5a are each formed of a conductive polysilicon film.

The interlayer insulating films 44 and 45 are formed on an upper layer side of the interlayer insulating film 43. The data line 6a, the relay electrodes 6b, and 6c are provided in a layer between the interlayer insulating film 43 and the interlayer insulating film 44. The data line 6a, the relay electrodes 6b, and 6c are formed of the same conductive film. The data line 6a, the relay electrodes 6b, and 6c are each formed of a light shielding conductive film such as a metal film, or a metal compound film. For example, the data line 6a, the relay electrodes 6b, and 6c are each formed of multilayer structure of a titanium layer/titanium nitride layer/aluminum layer/titanium nitride layer, or multilayer structure of a titanium nitride layer/aluminum layer/titanium nitride layer.

A contact hole 43a is provided in the interlayer insulating film 42 and the interlayer insulating film 43, and the data line 6a is electrically coupled to the second contact region 31t of the semiconductor film 31a via the contact hole 43a. A contact hole 43b is provided in the interlayer insulating film 43, and the relay electrode 6b is electrically coupled to the first capacitance electrode 4a via the contact hole 43b. A contact hole 43c is provided in the interlayer insulating film 43, and a relay electrode 6c is electrically coupled to the second capacitance electrode 5a via the contact hole 43c. The relay electrode 6c covers at least from the second low concentration region 31u to the first low concentration region 31f of the semiconductor film 31a from the electrode 9a side, and at least overlaps in plan view with the second low concentration region 31u.

The capacitance line 7a and the relay electrode 7b are provided in a layer between the interlayer insulating film 44 and the interlayer insulating film 45. The capacitance line 7a and the relay electrode 7b are formed of the same conductive film. The capacitance line 7a and the relay electrode 7b are each formed of a light shielding conductive film such as a metal film, or a metal compound film. For example, the capacitance line 7a and the relay electrode 7b are each formed of multilayer structure of a titanium layer/titanium nitride layer/aluminum layer/titanium nitride layer, or multilayer structure of a titanium nitride layer/aluminum layer/titanium nitride layer.

A contact hole 44c is provided in the interlayer insulating film 44, and the capacitance line 7a is electrically coupled to the relay electrode 6c via the contact hole 44c. Accordingly, the capacitance line 7a is electrically coupled to the second capacitance electrode 5a via the relay electrode 6c, and common potential is applied to the second capacitance electrode 5a from the capacitance line 7a. A contact hole 44b is provided in the interlayer insulating film 44, and the relay electrode 7b is electrically coupled to the relay electrode 6b via the contact hole 44b.

A contact hole 45a is formed in the interlayer insulating film 45, and the electrode 9a is electrically coupled to the relay electrode 7b via the contact hole 45a. Thus, the electrode 9a is electrically coupled to the first capacitance electrode 4a via the relay electrodes 7b and 6b. Here, the first capacitance electrode 4a is electrically coupled to the first contact region 31e of the semiconductor film 31a via a contact hole 42a formed in the interlayer insulating film 42. Thus, the electrode 9a is electrically coupled to the first contact region 31e of the semiconductor film 31a via the first capacitance electrode 4a.

In the liquid crystal device 100 configured as described above, light incident from the second substrate 20 side is shielded by the data line 6a, the relay electrode 6c, the capacitance line 7a, and the like provided on the second substrate 20 side with respect to the semiconductor film 31a, so incident on the semiconductor film 31a is suppressed. Further, even when light emitted from the first substrate 10 side is incident again from the first substrate 10 side, the light is shielded by the scan line 3a provided on the substrate body 19 side with respect to the semiconductor film 31a, thus incidence on the semiconductor film 31a is suppressed. Further, in the first substrate 10, the first light shielding wall 8a1 and the second light shielding wall 8a2 that penetrate through the interlayer insulating film 41 and reach the scan line 3a are provided at the side of the semiconductor film 31a, so that both of light traveling in the second direction Y intersecting the semiconductor film 31a after being incident from the second substrate 20 side, and light traveling in the second direction Y intersecting the semiconductor film 31a after being incident from the first substrate 10 side can be shielded by the first light shielding wall 8a1 and the second light shielding wall 8a2.

4. Configuration of Vicinity of Electrodes 9a and 25

Figure 6:
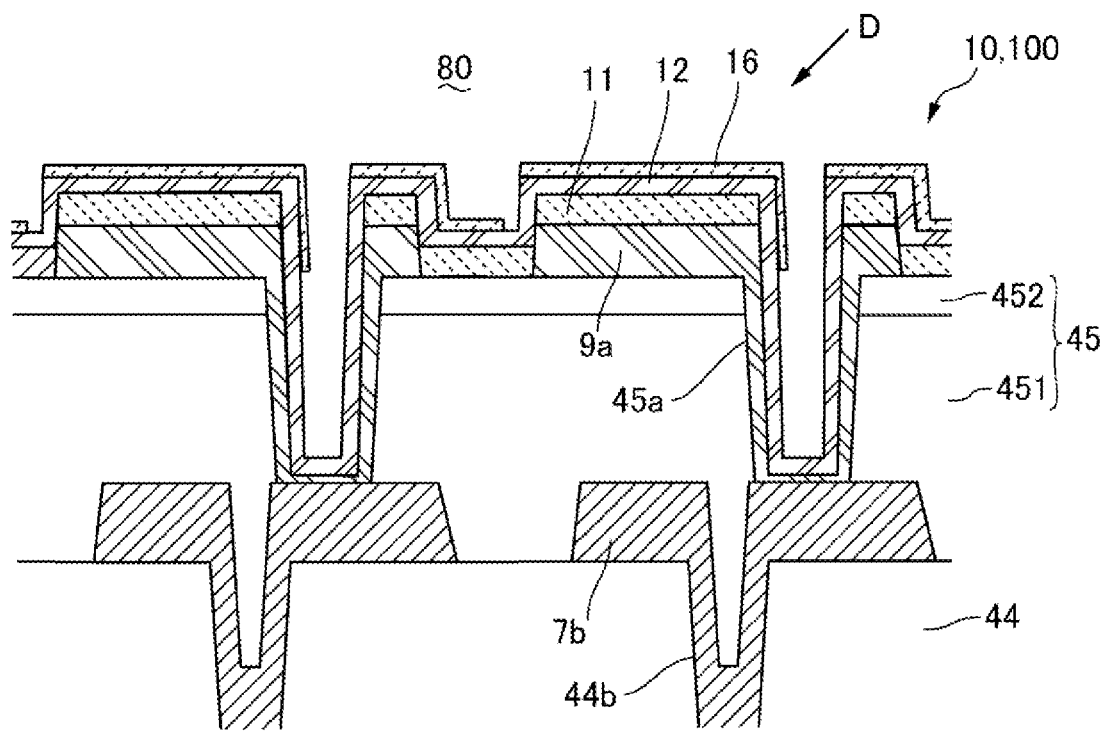
FIG. 6 is an explanatory diagram schematically illustrating an enlarged vicinity of an electrode illustrated in FIG. 4.
Figure 7:
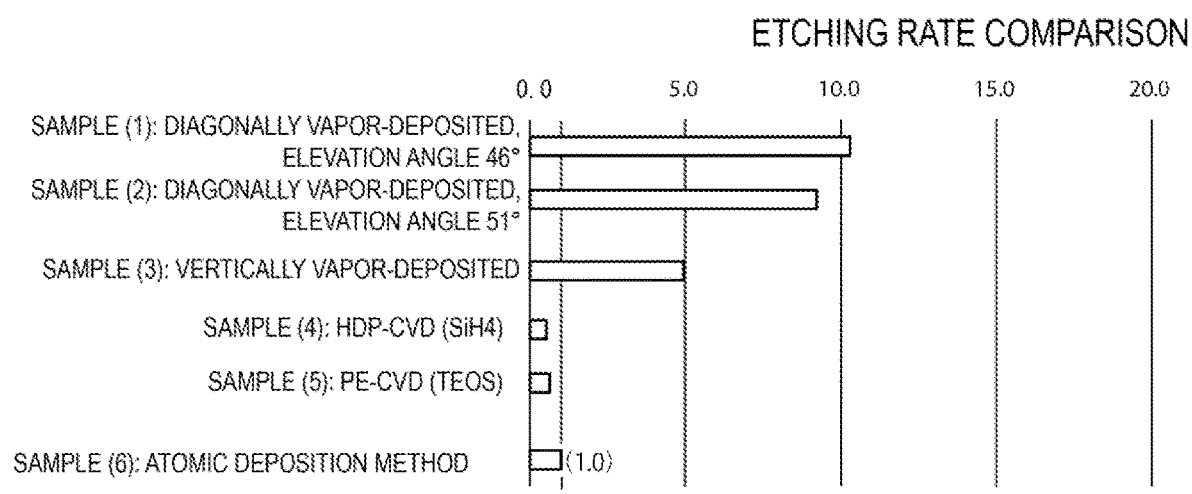
FIG. 7 is a graph showing etching rates of various silicon oxide films.

FIG. 6 is an explanatory diagram schematically illustrating an enlarged vicinity of the electrode 9a illustrated in FIG. 4. FIG. 6 schematically illustrates a vicinity of the two adjacent electrodes 9a. FIG. 7 is a graph showing etching rates of various silicon oxide films. FIG. 7 illustrates the etching rates of the various silicon oxide films in comparison with an etching rate of high density silicon oxide deposited by an atomic deposition method.

As illustrated in FIG. 4 and FIG. 5, on a surface side of the first substrate 10 facing the second substrate 20, the electrode 9a is in contact with the relay electrode 7b at a bottom of the contact hole 45a that extends through the interlayer insulating film 45, so that the electrode 9a and the relay electrode 7b are electrically coupled. Further, the first substrate 10 includes the electrode 9a, the oriented film 16 formed of a diagonally vapor-deposited film provided on the liquid crystal layer 80 side with respect to the electrode 9a, and an intermediate refractive index film 11 provided between the electrode 9a and the oriented film 16, on a surface side facing the second substrate 20. The intermediate refractive index film 11 has a refractive index between a refractive index of the electrode 9a and a refractive index of the oriented film 16. In the present exemplary embodiment, the oriented film 16 is a diagonally vapor-deposited film of silicon oxide. A thickness of the electrode 9a is small, and the thickness of the electrode 9a is equal to or less than 20 nm. For example, the thickness of the electrode 9a is from 15 nm to 20 nm.

The second substrate 20 includes the electrode 25, the oriented film 26 formed of a diagonally vapor-deposited film provided on the liquid crystal layer 80 side with respect to the electrode 25, and an intermediate refractive index film 21 provided between the electrode 25 and the oriented film 26, on a surface side facing the first substrate 10. The intermediate refractive index film 21 has a refractive index between a refractive index of the electrode 25 and a refractive index of the oriented film 26. In the present exemplary embodiment, the oriented film 26 is a diagonally vapor-deposited film of silicon oxide. A thickness of the electrode 25 is small, and the thickness of the electrode 25 is equal to or less than 20 nm. For example, the thickness of the electrode 25 is from 15 nm to 20 nm.

In the present exemplary embodiment, a high density silicon oxide film 12 having higher film density than that of the oriented film 16 is stacked between the intermediate refractive index film 11 and the oriented film 16, and a high density silicon oxide film 22 having higher film density than that of the oriented film 26 is stacked between the intermediate refractive index film 21 and the oriented film 26. As described below with reference to FIG. 7, high or low of film density can be determined by high or low of an etching rate of an etching solution to a silicon oxide film, and when the etching rate is low, it can be determined that film density is high. In the present exemplary embodiment, both the high density silicon oxide films 12 and 22 are films formed by the atomic deposition method.

Here, for the oriented films 16 and 26, the material and the film formation method are the same, and a design value of film thickness is the same for the oriented films 16 and 26. Thus, the film thickness is the same or substantially the same for the oriented films 16 and 26. For both the intermediate refractive index films 11 and 21, the material and the film formation method are the same, and a design value of a film thickness is the same for the intermediate refractive index films 11 and 21. Thus, the film thickness is the same or substantially the same for the intermediate refractive index films 11 and 21. For the high density silicon oxide films 12 and 22, the material and the film formation method are the same, and a design value of a film thickness is the same for the high density silicon oxide films 12 and 22. As a result, the film thickness is the same or substantially the same for the high density silicon oxide films 12 and 22. Therefore, in the following description, the oriented film 16, the intermediate refractive index film 11, and the high density silicon oxide film 12 on the first substrate 10 side will be mainly described, and description of the oriented film 26, the intermediate refractive index film 21, and the high density silicon oxide film 22 on the second substrate 20 side will be omitted.

In the first substrate 10 illustrated in FIG. 6, the refractive index of the electrode 9a is 2.1, while the refractive index of the oriented film 16 made of silicon oxide ($SiO_2$) is 1.46. Accordingly, the intermediate refractive index film 11 is a silicon nitride film represented by $SiN_x$ (refractive index=2.0), a silicon oxynitride film represented by SiON (refractive index=1.58 to 1.68), or an aluminum oxide film represented by $Al_2O_3$ (refractive index=1.77).

The intermediate refractive index film 11 is formed by a vertical vapor deposition method, a CVD method, or the like. Thus, the intermediate refractive index film 11 is formed at a surface of the electrode 9a, and between the adjacent electrodes 9a, but is hardly formed inside the contact hole 45a. In addition, of a side surface of the electrode 9a, an upper end portion is exposed from the intermediate refractive index film 11.

The high density silicon oxide film 12 is formed by the atomic deposition method. Therefore, the high density silicon oxide film 12 is formed on an upper layer side of the electrode 9a, and between the adjacent electrodes 9a, and is also appropriately formed inside the contact hole 45a. Further, the high density silicon oxide film 12 also covers the side surface of the electrode 9a. In addition, since the high density silicon oxide film 12 is a film formed by the atomic deposition method, film density is higher than that of the oriented film 16 formed by diagonal vapor deposition, and the film density is higher than that of a silicon oxide film formed by the vertical vapor deposition method. As a result, as illustrated in FIG. 7, the etching rate when in contact with water fluoride is low.

FIG. 7 compares weight losses when the following samples are in contact with 1 mass % of hydrogen fluoride water at a temperature of 23° C. In FIG. 7, a comparison is shown when the weight loss of the sample (6) is taken as 1, and the sample (6) is a silicon oxide film formed by the atomic deposition method. Note that, silane ($SiH_4$) was used as a raw material gas for film formation of the sample (4), and tetraethyl orthosilicate (tetraethyl orthosilicate (TEOS: Si $(OC_2H_5)_4$) was used as a raw material gas for film formation of the sample (5).

Samples

Sample (1): a silicon oxide film diagonally vapor-deposited at an elevation angle of 46°

Sample (2): a silicon oxide film diagonally vapor-deposited at an elevation angle of 51°

Sample (3): a silicon oxide film vertically vapor-deposited

Sample (4): a silicon oxide film formed by a high density plasma CVD method

Sample (5): a silicon oxide film formed by a plasma CVD method

Sample (6): a silicon oxide film formed by the atomic deposition method

As can be seen in FIG. 7, the high density silicon oxide film 12 formed by the atomic deposition method is significantly lower in the etching rate than the silicon oxide film diagonally vapor-deposited, and the silicon oxide film vertically vapor-deposited. For example, the high density silicon oxide film 12 has the etching rate of equal to or less than 40 nm/min when in contact with 1 mass % of hydrogen fluoride water at a temperature of 23° C. Particularly, the high density silicon oxide film 12 may have the etching rate of equal to or less than 20 nm/min when in contact with 1 mass % of hydrogen fluoride water at a temperature of 23° C.

Here, each of the silicon oxide film formed by the high density plasma CVD method, and the silicon oxide film formed by the plasma CVD method has the high film density, and the low etching rate, similar to the silicon oxide film formed by the atomic deposition method. However, the silicon oxide film formed by the atomic deposition method has superior step coverage, compared to the silicon oxide film formed by the high density plasma CVD method, and the silicon oxide film formed by the plasma CVD method, and covers the electrode 9a even inside the contact hole 45a. Thus, in the present exemplary embodiment, the high density silicon oxide film 12 was formed by the atomic deposition method.

In FIG. 6 again, because the oriented film 16 is the diagonally vapor-deposited film that is vapor-deposited from a diagonal direction indicated by an arrow D, the oriented film 16 is often not formed at the side surface of the electrode 9a or at a part that is shaded inside the contact hole 45a, but in the present exemplary embodiment, since the high density silicon oxide film 12 formed by the atomic deposition method is provided, the side surface of the electrode 9a and the like are not exposed, and a situation such as a contact between the electrode 9a and the liquid crystal layer 80 is unlikely to occur.

5. Method for Manufacturing Liquid Crystal Device 100

In a method for manufacturing the liquid crystal device 100 in the present exemplary embodiment, a first step in which the electrodes 9a and 25 are formed on the surface side of the first substrate 10 facing the second substrate 20, and on the surface side of the second substrate 20 facing the first substrate 10 respectively, and a second step in which the oriented films 16 and 26 are formed by the diagonal vapor deposition after the first step are performed.

In the present exemplary embodiment, after the first step and before the second step, a third step is performed in which the intermediate refractive index films 11 and 21 having the refractive index between the refractive index of the electrodes 9a and 25, and the refractive index of the oriented films 16 and 26. Additionally, in the present exemplary embodiment, after the third step and before the second step, a fourth step is performed in which the high density silicon oxide films 12 and 22 are formed by the atomic deposition method.

6. Main Effects of Present Exemplary Embodiment

As described above, in the liquid crystal device 100 of the present exemplary embodiment, the intermediate refractive index films 11 and 21 are provided between the oriented film 16 and the electrode 9a, and between the oriented film 26 and the electrode 25, respectively, and thus there are no interfaces having a large refractive index difference between the oriented film 16 and the electrode 9a, and between the oriented film 26 and the electrode 25. Accordingly, reflection between the oriented film 16 and the electrode 9a, and reflection between the oriented film 26 and the electrode 25 can be suppressed, so efficiency of utilization of light during display can be increased.

In addition, since the intermediate refractive index films 11 and 21 are provided between the oriented film 16 and the electrode 9a, and between the oriented film 26 and the electrode 25, respectively, parts of the side surfaces of the electrodes 9a and 25 can be covered with the intermediate refractive index films 11 and 21, respectively. In addition, since the film thickness of the electrode 9a is less than or equal to 20 nm, and is small, the side surface of the electrode 9a is less likely to be exposed from the intermediate refractive index film 11, when the intermediate refractive index film 11 is formed. Furthermore, since the high density silicon oxide film 12 is formed between the intermediate refractive index film 11 and the oriented film 16, the side surface of the electrode 9a can be further covered with the high density silicon oxide film 12. In addition, since the high density silicon oxide film 12 is formed by the atomic deposition method, the high density silicon oxide film 12 covers the side surface of the electrode 9a between the adjacent electrodes 9a, and is also appropriately formed inside the contact hole 45a. Accordingly, deterioration of the liquid crystal layer 80 caused by the electrode 9a and the liquid crystal layer 80 directly coming into contact with each other can be suppressed.

In addition, since the film thickness of the electrode 9a is small, a grain size of ITO in the electrode 9a is small. Therefore, when a film is formed at the upper layer of the electrode 9a, density of the film can be increased. Thus, because an interface between the first substrate 10 and the liquid crystal layer 80 is stable, deterioration of the liquid crystal layer 80 can be suppressed.

In addition, although no step or contact hole 45a is present on the second substrate 20 side originally, in the present exemplary embodiment, structure of a surface of the electrode 25 is identical to structure of the surface of the electrode 9a. As a result, the surface of the electrode 9a and the surface of the electrode 25 can be made symmetrical, so even when polarity inversion driving is performed during display, a bias of charge or the like is less likely to occur.

Improvement Example of Exemplary Embodiment 1

Figure 8:
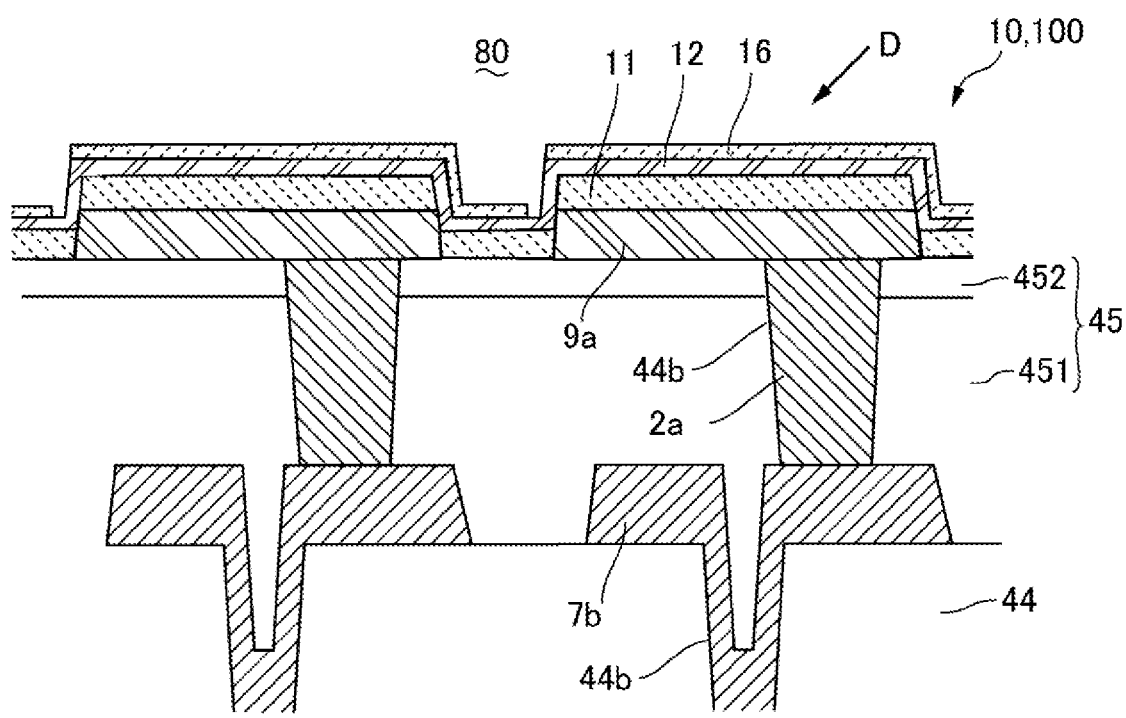
FIG. 8 is an explanatory diagram of a liquid crystal device according to an improvement example of Exemplary Embodiment 1 of the present disclosure.

FIG. 8 is an explanatory diagram of the liquid crystal device 100 according to an improvement example of Exemplary Embodiment 1 of the present disclosure. FIG. 8 illustrates an enlarged vicinity of the electrode 9a of the first substrate 10. Note that, a basic configuration of each of the present exemplary embodiment, Exemplary Embodiment 2, and Exemplary Embodiment 3 to be described later is the same as the configuration of Exemplary Embodiment 1, and thus common portions have the same reference symbols and description of the common portions will be omitted.

In Exemplary Embodiment 1, the electrode 9a is in contact with the relay electrode 7b at the bottom of the contact hole 45a that extends through the interlayer insulating film 45, but in the present exemplary embodiment, as illustrated in FIG. 8, an inside of the contact hole 45a that extends through the interlayer insulating film 45 is filled by a plug 2a made of a metal material such as tungsten, and the electrode 9a is electrically coupled to the relay electrode 7b via the plug 2a. To form the plug 2a, after the contact hole 45a is formed, a metal material such as tungsten is formed until the contact hole 45a is filled, and then the plug 2a is formed by performing a flattening treatment using chemical mechanical polishing or the like. The rest of the configuration is the same as Exemplary Embodiment 1, and an explanation thereof is thus omitted here.

According to this aspect, since the electrode 9a is not exposed inside the contact hole 45a illustrated in FIG. 6, it is possible to prevent the electrode 9a and the liquid crystal layer 80 from coming into direct contact inside the contact hole 45a.

Exemplary Embodiment 2

Figure 9:
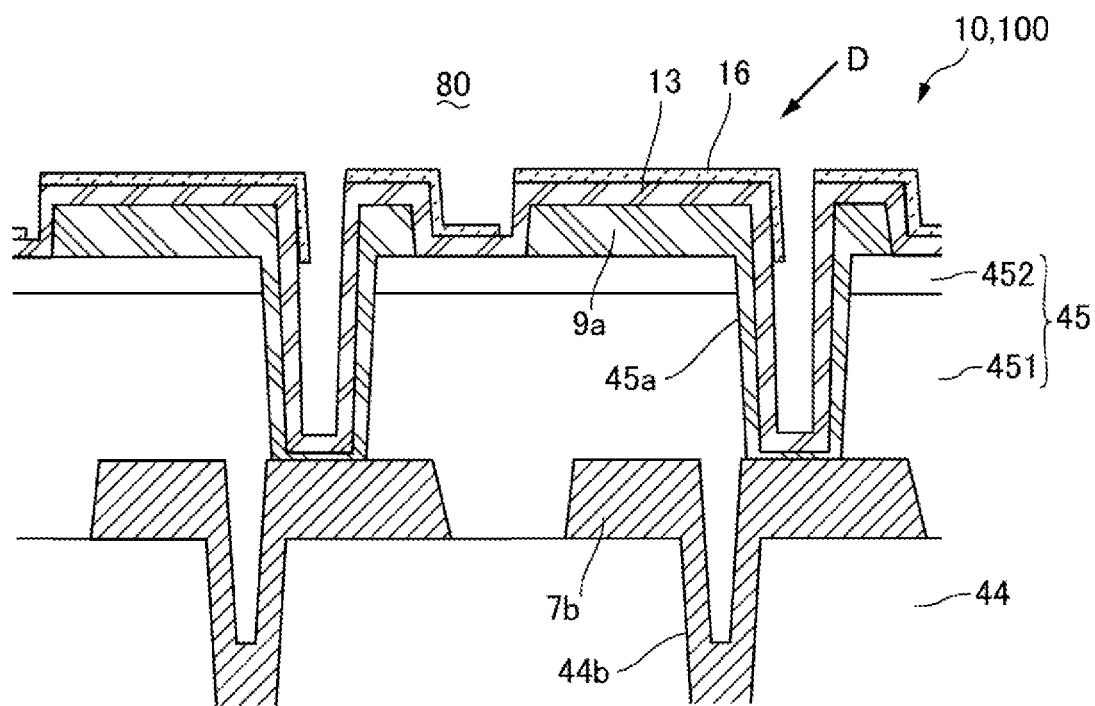
FIG. 9 is an explanatory diagram of a liquid crystal device according to Exemplary Embodiment 2 of the present disclosure.

FIG. 9 is an explanatory diagram of the liquid crystal device 100 according to Exemplary Embodiment 2 of the present disclosure. FIG. 9 illustrates an enlarged vicinity of the electrode 9a of the first substrate 10.

As illustrated in FIG. 9, on a surface side of the first substrate 10 facing the second substrate 20 of the liquid crystal device 100 of the present exemplary embodiment, the electrode 9a is in contact with the relay electrode 7b at a bottom of the contact hole 45a that extends through the interlayer insulating film 45, so that the electrode 9a and the relay electrode 7b are electrically coupled. Further, the first substrate 10 includes the electrode 9a, the oriented film 16 formed of a diagonally vapor-deposited film provided on the liquid crystal layer 80 side with respect to the electrode 9a, and an intermediate refractive index film 13 provided between the electrode 9a and the oriented film 16. The intermediate refractive index film 13 has a refractive index between a refractive index of the electrode 9a and a refractive index of the oriented film 16. The oriented film 16 is made of silicon oxide.

In the present exemplary embodiment, the intermediate refractive index film 13 is formed of a silicon nitride film (refractive index=2.0) or aluminum oxide (refractive index=1.77). Additionally, the intermediate refractive index film 13 is formed of a high density silicon nitride film having higher film density than that of a vapor-deposited film of silicon nitride, or of a high density aluminum oxide film having higher film density than that of a vapor-deposited film of aluminum oxide.

Furthermore, the intermediate refractive index film 13 is a film formed by an atomic deposition method. Accordingly, the intermediate refractive index film 13 is formed at an upper layer side of the electrode 9a, or between the adjacent electrodes 9a, and is also appropriately formed inside the contact hole 45a. Further, the intermediate refractive index film 13 also covers a side surface of the electrode 9a between the adjacent electrodes 9a.

In a method for manufacturing the liquid crystal device 100 in the present exemplary embodiment, a first step in which the electrodes 9a and 25 are formed on the surface side of the first substrate 10 facing the second substrate 20 and on a surface side of the second substrate 20 facing the first substrate 10 respectively, and a second step in which the oriented films 26 and 26 are formed by diagonal vapor deposition after the first step are performed. In addition, after the first step and before the second step, a third step is performed in which the intermediate refractive index film 13 having the refractive index between the refractive index of the electrodes 9a and 25, and the refractive index of the oriented films 16 and 26. In the present exemplary embodiment, when the intermediate refractive index film 13 is formed in the third step, a silicon nitride film or an aluminum oxide film is formed by the atomic deposition method.

As described above, in the liquid crystal device 100 of the present exemplary embodiment, the intermediate refractive index film 13 is provided between the oriented film 16 and the electrode 9a, so there are no interfaces having a large refractive index difference between the oriented film 16 and the electrode 9a. Therefore, reflection between the oriented film 16 and the electrode 9a can be suppressed, so efficiency of utilization of light during display can be increased. In addition, since the intermediate refractive index film 13 is formed by the atomic deposition method, the intermediate refractive index film 13 covers the side surface of the electrode 9a between the adjacent electrodes 9a, and is also appropriately formed inside the contact hole 45a. In addition, since a film thickness of the electrode 9a is less than or equal to 20 nm and is small, the side surface of the electrode 9a is less likely to be exposed from the intermediate refractive index film 11, when the intermediate refractive index film 13 is formed. Accordingly, deterioration of the liquid crystal layer 80 caused by the electrode 9a and the liquid crystal layer 80 directly coming into contact with each other can be suppressed.

Improvement Example of Exemplary Embodiment 2

Figure 10:
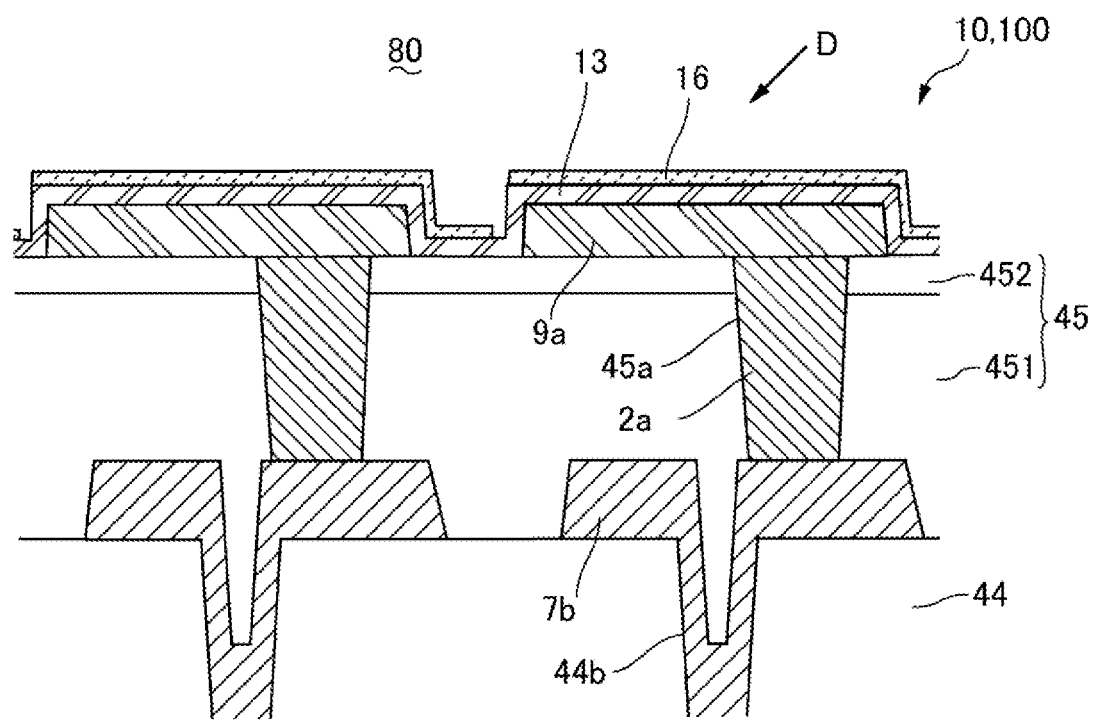
FIG. 10 is an explanatory diagram of a liquid crystal device according to an improvement example of Exemplary Embodiment 2 of the present disclosure.

FIG. 10 is an explanatory diagram of the liquid crystal device 100 according to an improvement example of Exemplary Embodiment 2 of the present disclosure. FIG. 10 illustrates an enlarged vicinity of the electrode 9a of the first substrate 10. In the present exemplary embodiment, as illustrated in FIG. 10, an inside of the contact hole 45a that extends through the interlayer insulating film 45 is filled by the plug 2a formed of a metal material such as tungsten, and the electrode 9a is electrically coupled to the relay electrode 7b via the plug 2a. The rest of the configuration is the same as Exemplary Embodiment 1, and an explanation thereof is thus omitted here.

According to this aspect, since the electrode 9a is not exposed inside the contact hole 45a illustrated in FIG. 9, it is possible to prevent the electrode 9a and the liquid crystal layer 80 from coming into direct contact inside the contact hole 45a.

Exemplary Embodiment 3

Figure 11:
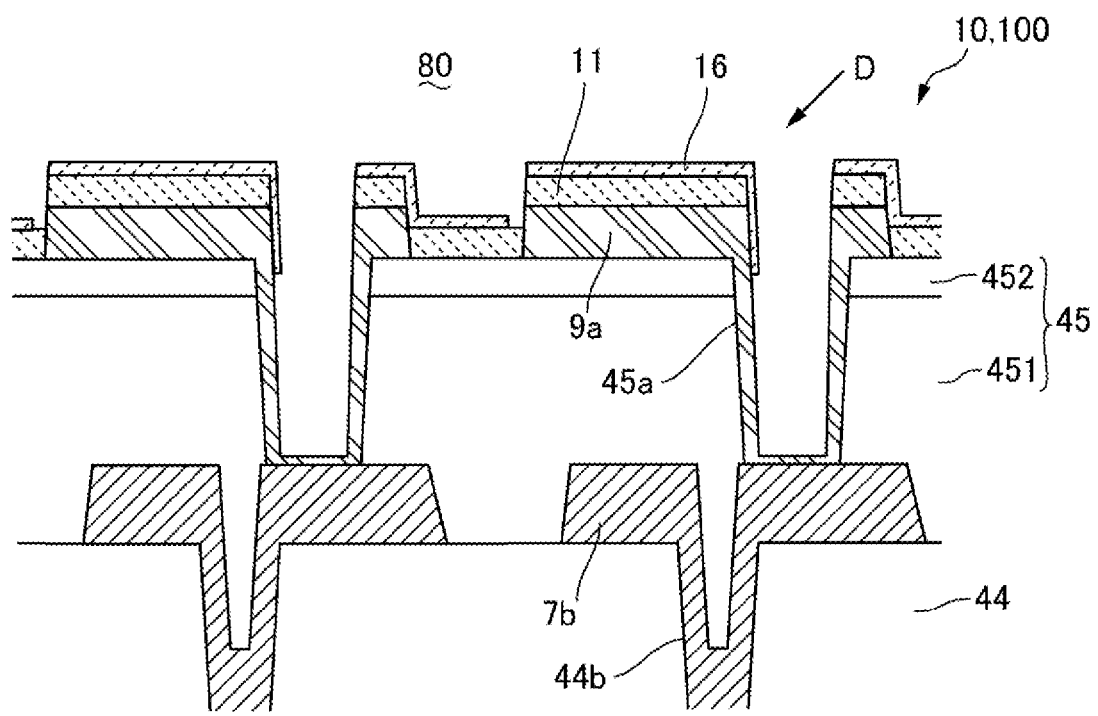
FIG. 11 is an explanatory diagram of a liquid crystal device according to Exemplary Embodiment 3 of the present disclosure.

FIG. 11 is an explanatory diagram of the liquid crystal device 100 according to Exemplary Embodiment 3 of the present disclosure. FIG. 11 illustrates an enlarged vicinity of the electrode 9a of the first substrate 10. As illustrated in FIG. 11, on a surface side of the first substrate 10 facing the second substrate 20 of the liquid crystal device 100 of the present exemplary embodiment, the electrode 9a is in contact with the relay electrode 7b at a bottom of the contact hole 45a that extends through the interlayer insulating film 45, so that the electrode 9a and the relay electrode 7b are electrically coupled. Further, the first substrate 10 includes the electrode 9a, the oriented film 16 formed of a diagonally vapor-deposited film provided on the liquid crystal layer 80 side with respect to the electrode 9a, and the intermediate refractive index film 11 provided between the electrode 9a and the oriented film 16. The oriented film 16 is made of silicon oxide.

The intermediate refractive index film 11 has a refractive index between a refractive index of the electrode 9a (=2.1) and a refractive index of the oriented film 16 (=1.46). For example, the intermediate refractive index film 11 is a silicon nitride film (refractive index=2.0), a silicon oxynitride film, or an aluminum oxide film (refractive index=1.77). Therefore, there are no interfaces having a large refractive index difference between the oriented film 16 and the electrode 9a. Accordingly, reflection between the oriented film 16 and the electrode 9a can be suppressed, so efficiency of utilization of light during display can be increased.

Improvement Example of Exemplary Embodiment 3

Figure 12:
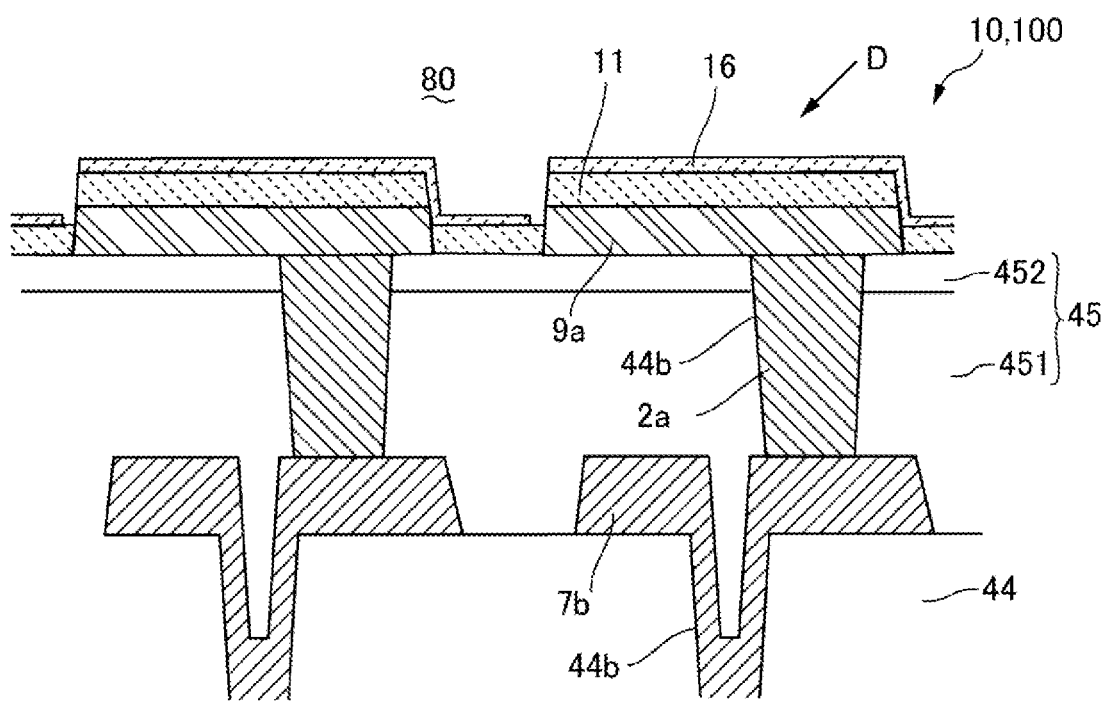
FIG. 12 is an explanatory diagram of a liquid crystal device according to an improvement example of Exemplary Embodiment 3 of the present disclosure.

FIG. 12 is an explanatory diagram of the liquid crystal device 100 according to an improvement example of Exemplary Embodiment 3 of the present disclosure. FIG. 12 illustrates an enlarged vicinity of the electrode 9a of the first substrate 10. In the present exemplary embodiment, as illustrated in FIG. 12, an inside of the contact hole 45a that extends through the interlayer insulating film 45 is filled by the plug 2a formed of a metal material such as tungsten, and the electrode 9a is electrically coupled to the relay electrode 7b via the plug 2a. The rest of the configuration is the same as Exemplary Embodiment 1, and an explanation thereof is thus omitted here.

According to this aspect, since the electrode 9a is not exposed inside the contact hole 45a illustrated in FIG. 11, it is possible to prevent the electrode 9a and the liquid crystal layer 80 from coming into direct contact inside the contact hole 45a.

Other Exemplary Embodiments

In the exemplary embodiment described above, the description has been given using the liquid crystal device 100 as the example in which light source light is incident from the second substrate 20 side, but the present disclosure may also be applied to the liquid crystal device 100 in which light source light is incident from the first substrate 10 side.

Installation Example to Electronic Apparatus

Figure 13:
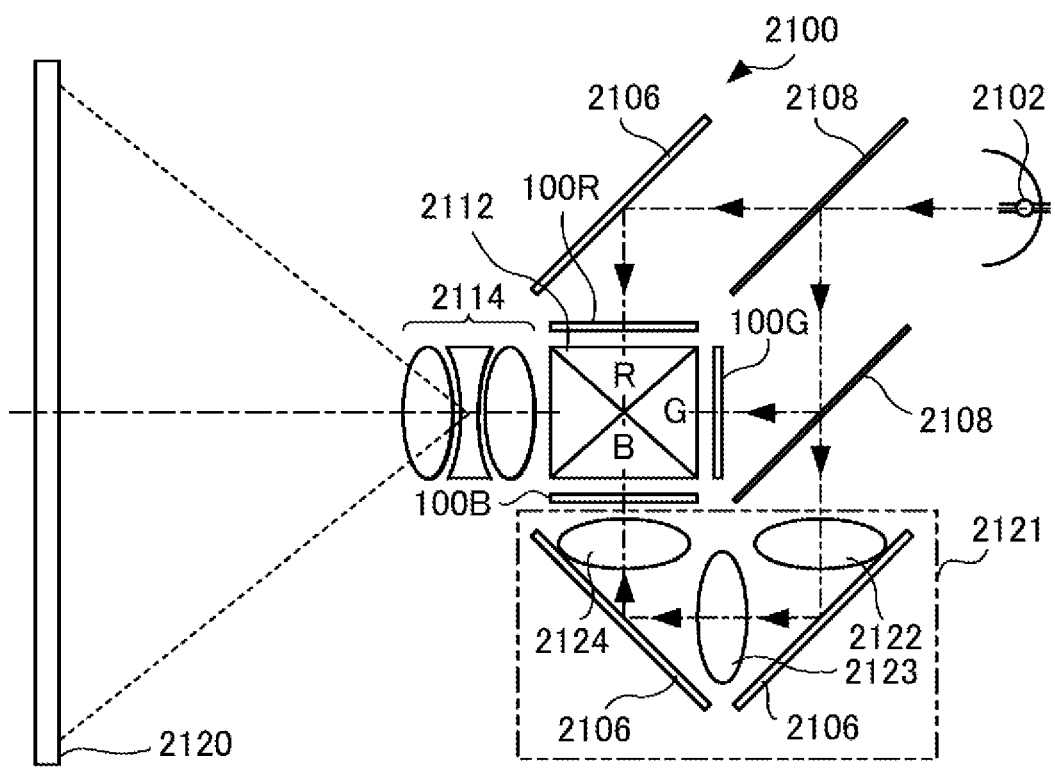
FIG. 13 is a schematic configuration diagram illustrating a projection-type display apparatus employing a liquid crystal device to which the present disclosure is applied.

An electronic apparatus using the liquid crystal device 100 according to the above-described exemplary embodiments will be described below. FIG. 13 is a schematic configuration diagram illustrating a projection-type display apparatus employing the liquid crystal device 100 to which the present disclosure is applied. Illustration of an optical element such as a polarizing plate is omitted in FIG. 13. A projection-type display apparatus 2100 illustrated in FIG. 13 is an example of an electronic apparatus employing the liquid crystal device 100. The projection-type display apparatus 2100, in which the liquid crystal device 100 is used as a light valve, can conduct high-definition and bright display without making the apparatus large. As illustrated in this figure, a light source unit 2102 configured by a lamp unit including a white light source such as a halogen lamp and the like is provided inside the projection-type display apparatus 2100. Projection light emitted from the light source unit 2102 is split into three primary colors of R (red), G (green), and B (blue) by three mirrors 2106 and two dichroic mirrors 2108 installed inside. The split incident light is guided to light valves 100R, 100G, and 100B corresponding to each of the primary colors, and then modulated. Note that since the light of the B color has a long optical path as compared to the other light of the R color and the G color, the light of the B color is guided via a relay lens system 2121 including an incidence lens 2122, a relay lens 2123, and an emission lens 2124 to prevent a loss due to the long optical path of the light of the B color.

The light modulated by each of the light valves 100R, 100G, and 100B is incident on a dichroic prism 2112 from three directions. Then, at the dichroic prism 2112 as an optical path synthesizing element, the light of the R color and the light of the B color are reflected at 90 degrees, and the light of the G color is transmitted. Therefore, light emitted from each of the light valves 100R, 100G, and 100B is synthesized by the dichroic prism 2112, which is the optical path synthesizing element, and a color image is projected by a projection optical system 2114 onto a screen 2120.

Improvement Example of Electronic Apparatus

In the projection-type display apparatus 2100 illustrated in FIG. 13, when the liquid crystal device 100 used for the light valve 100B on which blue (B) color light is incident as light in a first wavelength range is used as a first liquid crystal device, and the liquid crystal device 100 used for the light valve 100G on which green (G) color light is incident as light in a second wavelength range longer in wavelength than the first wavelength range is used as a second liquid crystal device, respective thicknesses of the electrodes 9a and 25 may be made thinner in the first liquid crystal device than in the second liquid crystal device.

In addition, when the liquid crystal device 100 used for the light valve 100G on which the green (G) color light is incident as light in a first wavelength range is used as a first liquid crystal device, and the liquid crystal device 100 used for the light valve 100R on which red (R) color light is incident as light in a second wavelength range longer in wavelength than the first wavelength range is used as a second liquid crystal device, the respective thicknesses of the electrodes 9a and 25 may be made thinner in the first liquid crystal device than in the second liquid crystal device.

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

An electronic apparatus including the liquid crystal device 100 to which the present disclosure is applied is not limited to the projection-type display apparatus 2100 of the above-described exemplary embodiment. Examples of the electronic apparatus may include a projection-type head up display, a direct-view-type head mounted display, a personal computer, a digital still camera, and a liquid crystal television.

What is claimed is:

1. A liquid crystal device, comprising:
a first substrate;
a second substrate facing the first substrate; and
a liquid crystal layer disposed between the first substrate and the second substrate, wherein
the first substrate or the second substrate includes:
an electrode containing ITO,
an oriented film provided between the electrode and the liquid crystal layer, and containing silicon oxide,
an intermediate refractive index film provided between the electrode and the oriented film, and having a refractive index between a refractive index of the electrode and a refractive index of the oriented film, and
a high density silicon oxide film, different from the intermediate refractive index film and having higher film density than that of a vapor-deposited film of silicon oxide, that is stacked between the intermediate refractive index film and the oriented film.

2. The liquid crystal device according to claim 1, wherein the high density silicon oxide film is lower in etching rate when in contact with 1 mass % of hydrogen fluoride water at a temperature of 23° C. than a vapor-deposited film of silicon oxide.

3. The liquid crystal device according to claim 2, wherein the etching rate of the high density silicon oxide film is equal to or less than 40 nm/min.

4. The liquid crystal device according to claim 3, wherein the etching rate of the high density silicon oxide film is equal to or less than 20 nm/min.

5. The liquid crystal device according to claim 1, wherein the intermediate refractive index film is a silicon nitride film, a silicon oxynitride film, or an aluminum oxide film.

6. The liquid crystal device according to claim 1, wherein the intermediate refractive index film is formed of a high density silicon nitride film having higher film density than that of a vapor-deposited film of silicon nitride, or of a high density aluminum oxide film having higher film density than that of a vapor-deposited film of aluminum oxide.

7. The liquid crystal device according to claim 1, wherein the first substrate and the second substrate are the same in any of thickness of the electrode, thickness of the intermediate refractive index film, and thickness of the oriented film.

8. The liquid crystal device according to claim 1, wherein the electrode has a film thickness from 15 nm to 20 nm.

9. The liquid crystal device according to claim 1, wherein
in the first substrate, the electrode is a pixel electrode provided on the liquid crystal layer side of a substrate body,
the first substrate includes a relay electrode provided between the substrate body and the pixel electrode, and an interlayer insulating film provided between the relay electrode and the pixel electrode, and
the pixel electrode is electrically coupled to the relay electrode via a plug filled inside a contact hole extending through the interlayer insulating film.

10. An electronic apparatus comprising the liquid crystal device according to claim 1.

11. The electronic apparatus according to claim 10, wherein
as the liquid crystal device, a first liquid crystal device on which light in a first wavelength range is incident, and a second liquid crystal device on which light in a second wavelength range longer in wavelength than the first wavelength range is incident are provided,
an optical path synthesizing element is provided for synthesizing light emitted from the first liquid crystal device, and light emitted from the second liquid crystal device, and emitting the synthesized light, and
a thickness of the electrode in the first liquid crystal device is smaller than a thickness of the electrode in the second liquid crystal device.

12. The liquid crystal device according to claim 1, wherein
a relay electrode is electrically connected to the electrode through a contact hole,
the high density silicon oxide film is disposed inside the contact hole, and
the intermediate refractive index film is not disposed inside the contact hole.

\* \* \* \* \*